United States Patent [19]
Lee

[11] Patent Number: 5,248,350
[45] Date of Patent: Sep. 28, 1993

[54] STRUCTURE FOR IMPROVING GATE OXIDE INTEGRITY FOR A SEMICONDUCTOR FORMED BY A RECESSED SEALED SIDEWALL FIELD OXIDATION PROCESS

[75] Inventor: Steven S. Lee, Colorado Springs, Colo.

[73] Assignee: NCR Corporation, Dayton, Ohio

[21] Appl. No.: 622,107

[22] Filed: Nov. 30, 1990

[51] Int. Cl.$^5$ ............................................. H01L 21/76
[52] U.S. Cl. .................. 148/33.2; 148/33.3; 437/72
[58] Field of Search ............... 437/69, 72; 148/33.3, 148/33.2; 357/49, 50, 54; 257/510, 513

[56] References Cited

U.S. PATENT DOCUMENTS

| | | | |
|---|---|---|---|
| 4,407,696 | 10/1983 | Han et al. | 156/653 |
| 4,508,757 | 4/1985 | Fabricius et al. | 437/72 |
| 4,923,563 | 5/1990 | Lee | 437/72 |
| 4,986,879 | 1/1991 | Lee | 437/72 |
| 5,002,898 | 3/1991 | Fritzinger et al. | 437/72 |

FOREIGN PATENT DOCUMENTS

| | | | |
|---|---|---|---|
| 60-38832 | 2/1985 | Japan | 437/72 |
| 62-211938 | 9/1987 | Japan . | |

OTHER PUBLICATIONS

Ghezzo, M., et al., "LOPOS: Advanced Device Isolation for a 8μm CMOS/Back Process Technology", *J. Electrochem. Soc.* vol. 136, No. 7, Jul. 1989 pp. 1992–1996.

Teng, C., et al., "Optimization of Sidewall Masked Isolation Process", *IEEE Journal of Solid State Circuits*, vol. SC-20, No. 1, Feb. 1985 pp. 44–51.

Wolf S., *Silicon Processing For the VLSI Era, vol. 2: Process Integration*, ©1990, pp. 35–40.

Primary Examiner—G. Fourson
Attorney, Agent, or Firm—Douglas S. Foote

[57] ABSTRACT

A process for forming field oxide regions between active regions in a semiconductor substrate. Pad oxide, polysilicon and first silicon nitride layers are successively formed over substrate active regions. The first nitride layer, polysilicon layer, pad oxide layer and a portion of the substrate are then selectively etched to define field oxide regions with substantially vertical sidewalls. A second silicon nitride is provided on the substantially vertical sidewalls, and field oxide is grown in the field oxide regions. The first silicon nitride, polysilicon and pad oxide layers are then removed. The presence of the polysilicon layer prevents the formation of a sharp corner between the field oxide and active regions if an overetch occurs during the removal of the pad oxide layer.

11 Claims, 5 Drawing Sheets

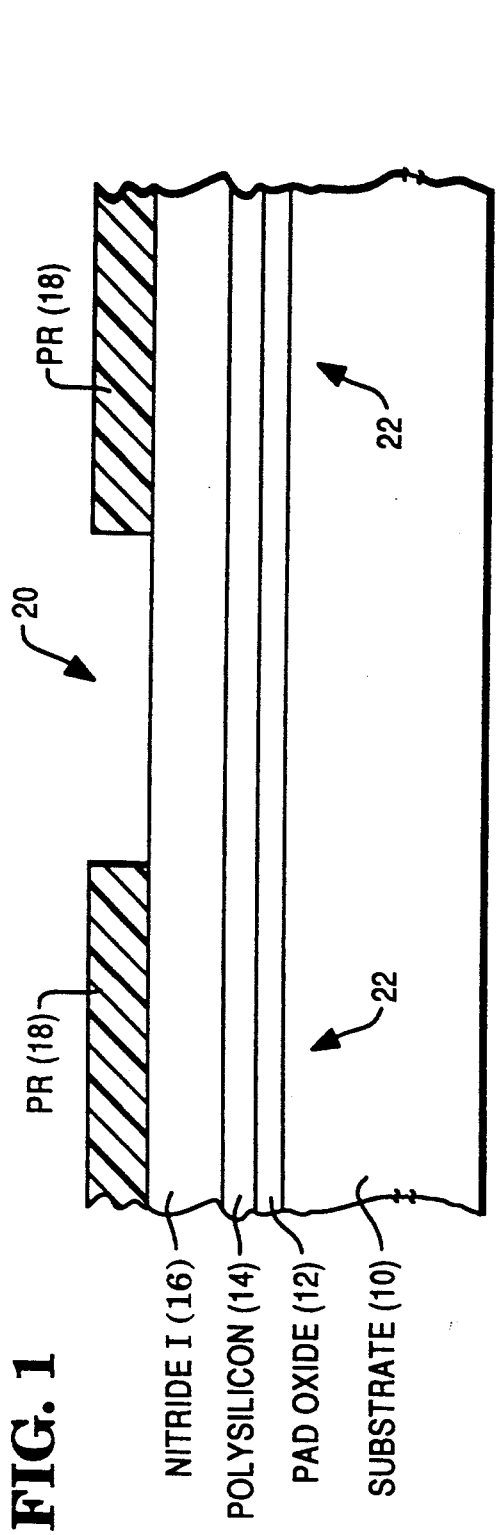
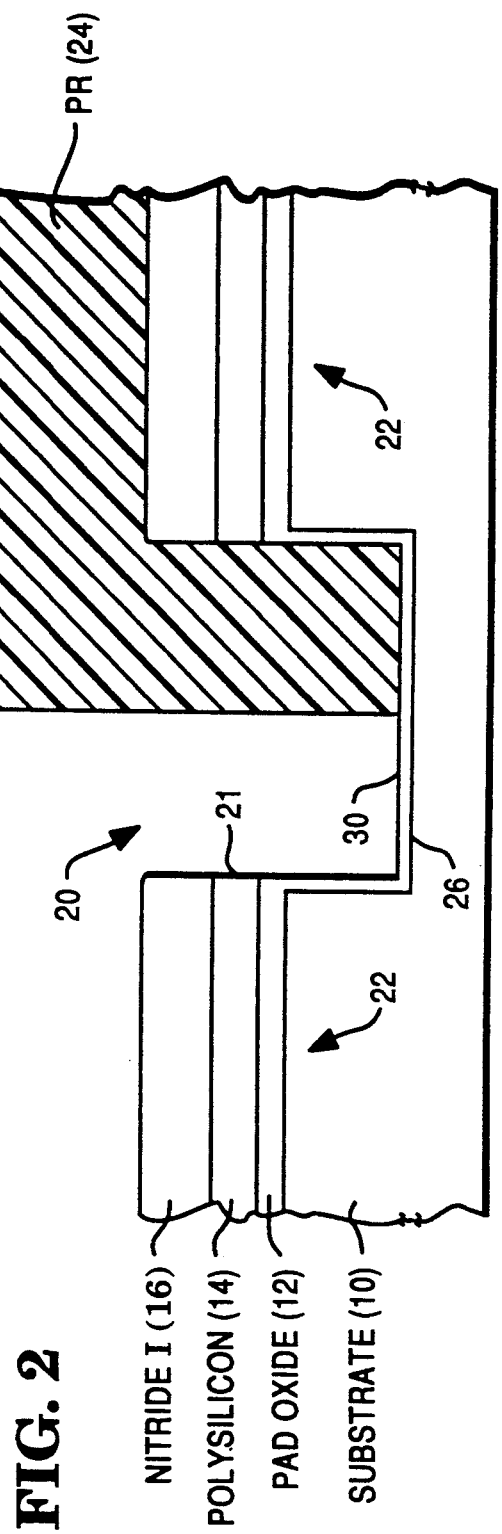

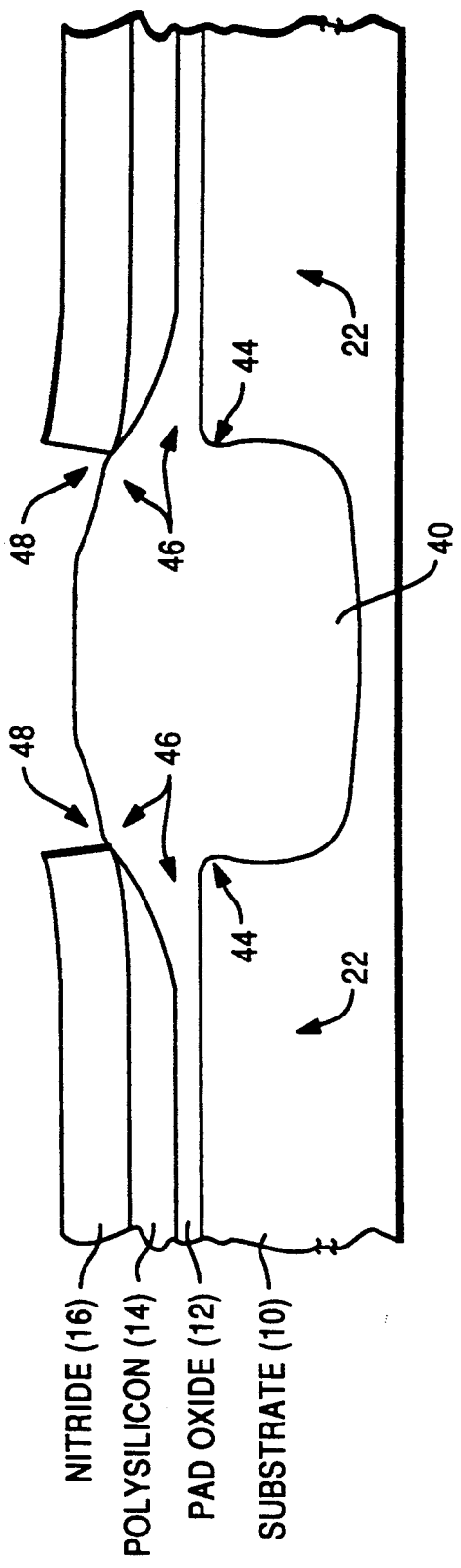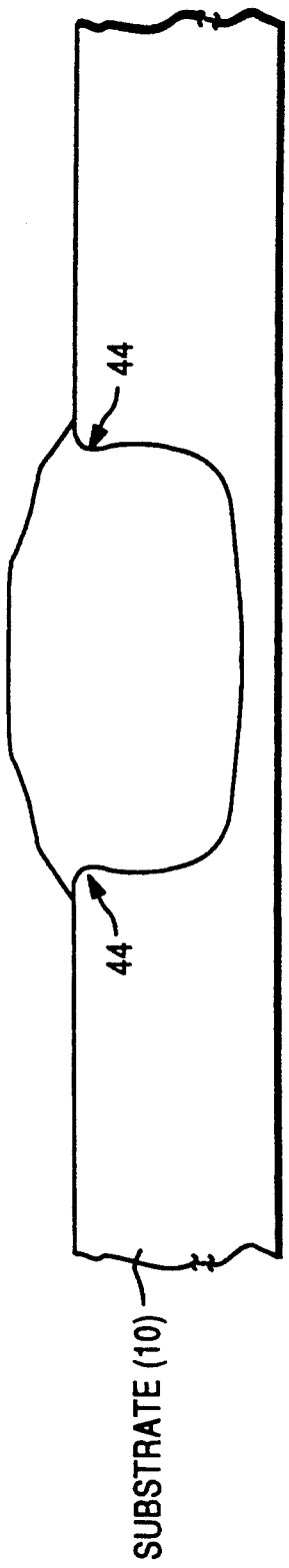

SUBSTRATE (10)

SUBSTRATE (10)

STRUCTURE FOR IMPROVING GATE OXIDE INTEGRITY FOR A SEMICONDUCTOR FORMED BY A RECESSED SEALED SIDEWALL FIELD OXIDATION PROCESS

The present invention relates in general to a method of making integrated electronic circuits. More particularly, it relates to a process for forming field regions filled with silicon dioxide dielectric between active regions of a silicon substrate which results in an improved structure for the growth of gate oxide.

CROSS-REFERENCE TO RELATED APPLICATIONS

This application is related to co-pending application Ser. No. 496,567, filed on Mar. 19, 1990, now U.S. Pat. No. 4,986,879, which is a continuation-in-part of application Ser. No. 356,591, filed on May 8, 1990, now issued as U.S. Pat. No. 4,923,563.

BACKGROUND OF THE INVENTION

The fabrication of an integrated circuit normally begins by processing the semiconductor substrate or wafer to divide the surface area into regions where active devices and substrate embedded interconnects are to be formed, and other regions of dielectric which electrically separate the active regions. The field oxide dielectric material is routinely silicon dioxide. Though various field oxide formation techniques have been developed and described, the technique commonly known as the localized oxidation of silicon (LOCOS) remains common within the semiconductor industry. In the practice of LOCOS, the active regions of the silicon substrate are masked by a silicon nitride layer, while the field oxide regions are thermally oxidized to form a field dielectric region. Though fundamentally simple and efficient, the LOCOS process, and its progeny, such as the FUROX and SWAMI techniques, exhibit deficiencies which reduce yield or performance in the final semiconductor chip product.

The most frequently encountered deficiency in the prior art techniques is commonly known as the bird's beak problem, wherein the field oxide extends under the masking nitride layer to consume some of the usable active area. Additional problems routinely encountered with known field oxide formation processes include stress induced dislocations at the edges of the active region, and the presence of a relatively nonplanar surface in or adjacent the fully formed field oxide. The nonplanar recesses or notches at the edges of the active region often degrade subsequently formed gate oxide, which can trap conductive layer residuals creating short circuit paths. Solutions to these problems have been proposed, but routinely involve relatively complex or dimensionally critical fabrication sequences which are costly to practice or degrade the semiconductor chip yield.

The importance of overcoming the various deficiencies noted above is evidenced by the extensive technological development directed to the subject, as documented by the relevant patent and technical literature. The closest and apparently most relevant technical developments in the patent literature can be gleaned by considering U.S. Pat. Nos. 3,958,040; 4,398,992; 4,088,516; 4,333,965; 4,563,227; 4,564,394; 4,622,096 and 4,631,219. Relevant technical literature includes the article entitled "Isolation Technology For Scaled MOS VLSI" by Oldham, which appeared as paper 9.1 in IEDM 82, pages 216–219; the article entitled "A Bird's Beak Free Local Oxidation Technology Feasible For VSLI Circuits Fabrication" by Chiu et al., which appeared in the IEEE Transactions On Electron Devices, pages 536–540, April 1982; the article entitled "The Sloped-Wall SWAMI—A Defect-Free Zero Bird's-Beak Local Oxidation Process For Scaled VLSI Technology" by Chiu et al., which appeared in the IEEE Transactions On Electron Devices, pages 1506–1511, November 1983; the article entitled "Defect Characteristics And Generation Mechanism In A Bird Beak Free Structure By Sidewall Masked Technique" by Fang et al., which appeared in the Journal of Electrochemical Society, pages 190–196, 1983; the article entitled "A New Fully Recessed-Oxide (FUROX) Field Isolation Technology For Scaled VLSI Circuit Fabrication" by Tsai et al., which appeared in the IEEE Electron Device Letters, pages 124–126, February 1986; the article entitled "A Method For Saving Planar Isolation Oxides Using Oxidation Protected Sidewalls" by Kahng et al., which appeared in the Journal of Electrochemical Society, pages 2468–2471, November 1980; the article entitled "The SWAMI—A Defect Free And Near-Zero Bird's-Beak Local Oxidation Process And Its Application In VLSI Technology" by Chiu et al., which appeared as pages 9.3 in IEDM 82, pages 224–227, 1982; the article entitled "Defect Free Process Of A Bird's Beak Reduced LOCOS" by Inuishi et al., which appeared as Abstract No. 273 in an unknown publication, pages 409–410, of 1985 or later date; and the article entitled "Optimization of Sidewall Masked Isolation Process" by Teng et al., which appears in IEEE Journal of Solid-State Circuits, pages 44–51, February 1985. The diversity and complexity of the various technical approaches substantiates the difficulty and importance of developing a commercially viable process for isolating active regions in a silicon substrate during the fabrication of integrated circuits.

Though a number of the techniques successfully attack and solve the bird's beak problem, and usually provide relatively planar final concluding surfaces, the approaches routinely create stress induced dislocations at the edges of the active regions, and form topologies which include notches or grooves of sufficient dimension to cause the degradation of subsequently formed gate oxide. The stress induced dislocations are often not even recognized, while the notches or grooves are most often visible in the SEM cross-sections of the final structures.

A process which overcomes many if not most of the problems encountered by the prior art processes is known as recessed sealed sidewall field oxidation (RESSFOX). The RESSFOX process is disclosed in U.S. Pat. No. 4,923,563. In brief, the RESSFOX process utilizes a relatively thick pad oxide below a first masking nitride layer. A second, very thin, masking nitride layer is applied to the sidewall of an etched opening to define the lateral boundaries of a field oxide region. The thin sidewall masking nitride layer does not utilize an underlying pad oxide layer although it may include a thin underlying screening oxide. Upon oxidation, the thin sidewall nitride is concurrently lifted and converted to oxide, the materials and dimension being selected to ensure that when the field oxide level approaches the level of the thick pad oxide layer stresses at the corners of the active silicon region are relieved through various oxide paths and accentuated oxidation effects.

After the field oxide growth, and in preparation for the formation of active devices, the substrate in the active regions is exposed. This is achieved by removing a topmost oxidized nitride layer (formed during the field oxide growth), such as by etching with HF. The first masking nitride layer is then removed with an acid such as a hot $H_3PO_4$, and the pad oxide is removed by a chemical (HF) etch. Of course, a portion of the field oxide is also removed each time an oxide layer is removed by a chemical etch. If the etching chemical remains too long on the surface of the chip, overetching of the field oxide occurs and a corner of the substrate is exposed on the boundary of the field oxide region. The gate oxide for the active devices is then grown on the surface of the resulting structure. Under carefully controlled processing, the structure underlying the gate oxide is well suited for gate oxide growth. However, if corners are exposed by overetching, a thinning of the subsequently grown gate oxide can occur which can create integrity/reliability problems for the resulting chip.

OBJECTS OF THE INVENTION

It is therefore an object of the present invention to provide a new and improved structure and method for improving semiconductor gate oxide integrity.

It is another object of the present invention to provide a semiconductor structure for enhancing a recessed sealed sidewall field oxidation process.

It is a further object of the present invention to provide an improved recessed sealed sidewall field oxidation process which provides an improved semiconductor structure for the growth of gate oxide thereon.

It is yet another object of the present invention to provide a structure and method for forming a semiconductor chip which reduces the processing criticality of the oxide removal after field oxide growth.

SUMMARY OF THE INVENTION

One form of the present invention is a process for forming field oxide regions between active regions in a semiconductor substrate. Pad oxide, polysilicon and first silicon nitride layers are successively formed over substrate active regions. The first nitride layer, polysilicon layer, pad oxide layer and a portion of the substrate are then selectively etched to define field oxide regions with substantially vertical sidewalls. A second silicon nitride is provided on the substantially vertical sidewalls, and field oxide is grown in the field oxide regions. The first silicon nitride, polysilicon and pad oxide layers are then removed. The presence of the polysilicon layer prevents the formation of a sharp corner between the field oxide and active regions if an overetch occurs during the removal of the pad oxide layer.

BRIEF DESCRIPTION OF THE DRAWINGS

FIGS. 1-4 are cross-sectional schematic representations of an integrated circuit substrate at various stages in the fabrication sequence prior to field oxide growth.

FIGS. 5-7 schematically illustrate, in cross-section, progressive stages of the field oxide growth.

FIGS. 8-9 schematically illustrate, in cross-section, selected stages leading up to and including the formation of gate oxide.

DESCRIPTION OF A PREFERRED EMBODIMENT

Figure 3:
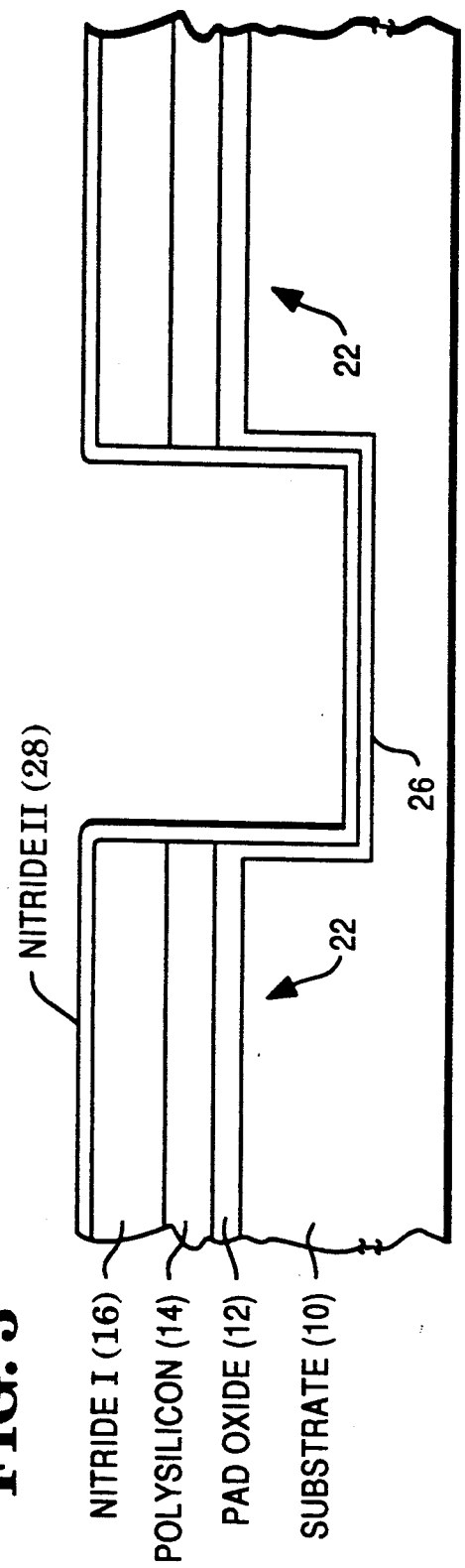

FIG. 1 shows a silicon substrate 10, a pad oxide layer 12 overlying substrate 10, a polysilicon layer 14 overlying pad oxide layer 12, a silicon nitride layer 16 overlying polysilicon layer 14, and topped off with a patterned photoresist 18. To create the structure in FIG. 1, the silicon substrate 10 is first thermally oxidized to form pad oxide layer 12 having a nominal thickness of 5-100 nanometers.

As further shown in FIG. 1, pad oxide 12 on substrate 10 is then covered by polysilicon layer 14, formed to a nominal thickness of 3-100 nm by chemical vapor deposition (CVD) process or the like. In the prior art, polysilicon layers are frequently used for stress relief purposes. However, the RESSFOX process does not require stress relief at this point. Polysilicon layer 14 serves the quite distinct purpose of preventing a sharp corner between the active and field oxide regions from being exposed in the event of an overetch, as will be discussed more fully herein.

The silicon nitride I layer 16 is preferably formed to a nominal thickness of 10-500 nm by LPCVD. In preparation for a selective etch, photoresist 18 is deposited and photolithographically processed to retain a photoresist (PR) mask pattern exposing nitride I layer 16 at opening 20, generally corresponding to the field oxide formation region between active regions 22 in substrate 10.

To reach the stage of fabrication depicted in FIG. 2, the structure in FIG. 1 is anisotropically etched using a conventional reactive ion etching (RIE) process to remove nitride I layer 16 not masked by photoresist 18, the aligned segment of polysilicon 14 and pad oxide layer 12, and a section of substrate 10 suitable to form a recess between 30 and 150 nanometers deep into substrate 10. The opening 20 created by the selective etch through nitride layer 16, polysilicon layer 14, pad oxide layer 12 and into substrate 10 defines a region for field oxide growth, as will be described in more detail as follows. Opening 20 is bounded by vertical sidewall surface 21 and a horizontal adjoining bottom surface 30. Preferably, sidewall surface 21 is normal to bottom surface 30 as well as each of the pad oxide 12, polysilicon 14 and nitride 16 layers. Photoresist 18 is next stripped, and a field implant may be performed, for example, to provide a channel stop for an NMOS transistor. This implant is done by doping selected regions of the substrate through selected horizontally disposed surfaces of the substrate prior to the growth of field oxide in opening 20. In a CMOS device the field oxide will separate NMOS and PMOS transistors. For such device the PMOS side of opening 20 is masked with photoresist 24 prior to the field implant in the NMOS side. Because photoresist materials typically include elements which may contaminate substrate 1, and because photoresist adhesion to silicon is relatively poor, a thin screening oxide layer 26 may be formed on the sidewalls over the substrate and pad oxide layer prior to the application of the photoresist to prevent contamination during field implantation. Screening oxide 26 with nominal thickness of less than 20 nm and preferably about 10 nm may be thermally grown on bottom surface 30 and sidewall 21, followed by the application of photoresist 24. After the field implant, photoresist 24 is removed. Screening oxide 26 may also be removed. However, since screening 26 oxide is so thin, it is not necessary to remove it prior to further processing. It has been found that the presence of screening oxide 26 does not degrade the process, i.e., the screening oxide is sufficiently thin so that there is no significant increase in lateral encroachment during field oxide growth.

Figure 4:
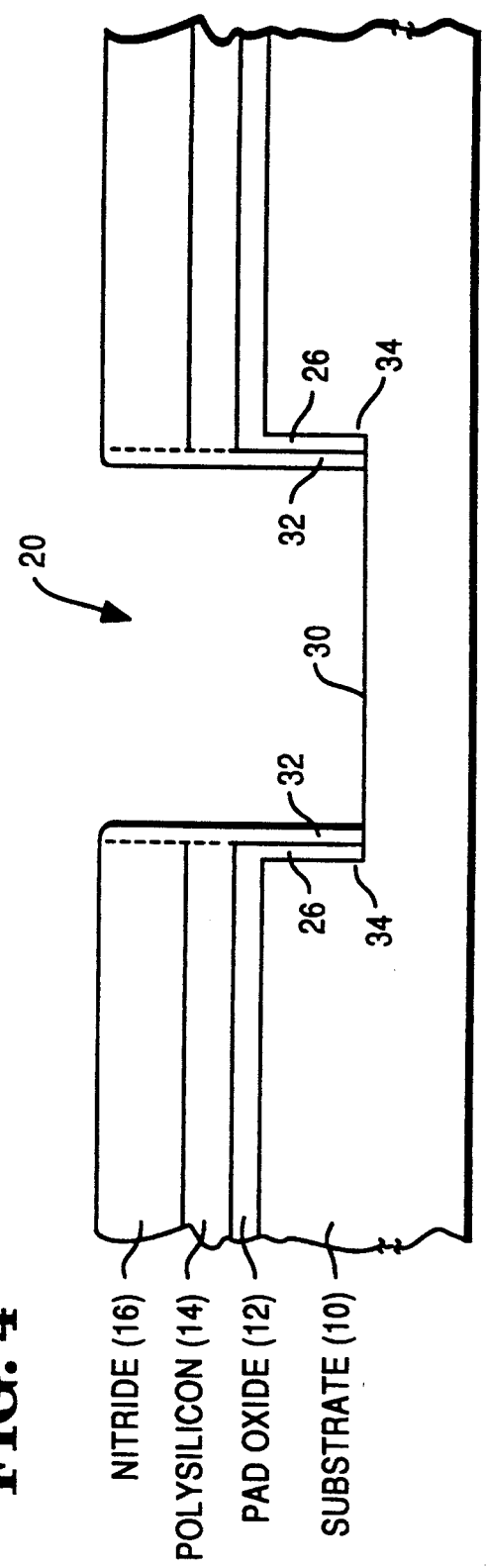

As shown in FIG. 3, a second silicon nitride II layer 28 is deposited by an LPCVD process to conformally cover the structure. The structure is then subjected to another anisotropic etch, this etch serving to remove the silicon nitride from exposed horizontal surfaces. As a consequence of such anisotropic etch, as shown in FIG. 4, the bottom surface 30 of the recess at opening 20 in silicon substrate 10 is exposed to the substrate silicon, while sidewall silicon nitride II layer 32 (which overlies sidewall surface 21) is retained but thinned by a nominal amount.

Note that at most only a nominal amount of screening oxide is disposed between sidewall 21 and sidewall nitride 32, thereby inhibiting the movement of oxygen species along the underside of sidewall nitride layer 32 during thermal field oxide growth. Clearly, oxygen species are also blocked from direct access to pad oxide layer by sidewall nitride layer 32 during the initial stages of field oxide growth. The dimensions of sidewall nitride layer 32 are relatively crucial, not only in controlling the oxidation effects, but also in avoiding coefficient of expansion differential induced stress damage along sidewalls 34 of silicon substrate 10. Namely, sidewall nitride 32 is sufficiently thin at 25 nm or less to yield rather than cause stress damage to silicon substrate 10. Sidewall 34 is oxidized at a rate suitable to facilitate bending and lifting with silicon dioxide growth, yet is sufficiently thick to block oxidizing species' access to the pad oxide region until the specifically desired time. In a preferred embodiment, nitride II layer 32 has a nominal thickness of 5–25 nm.

Figure 5:
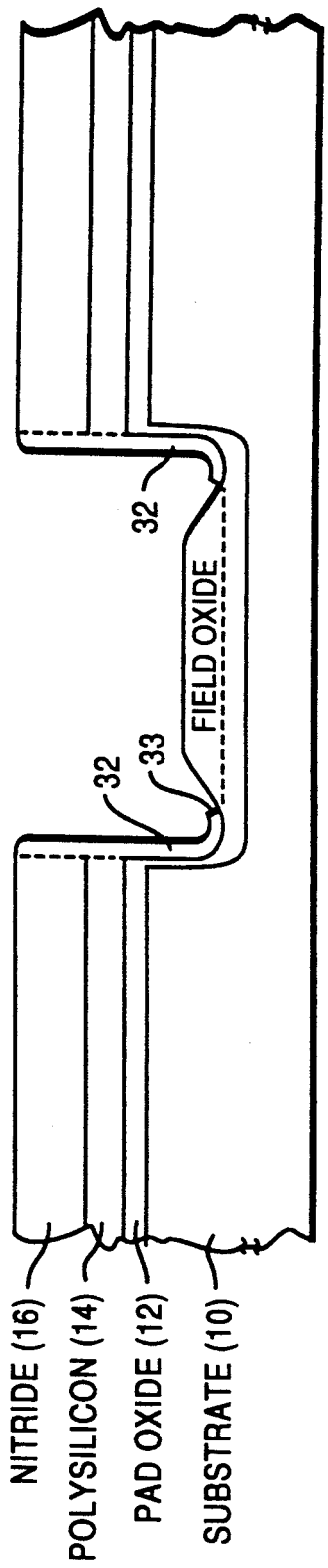
Figure 6:
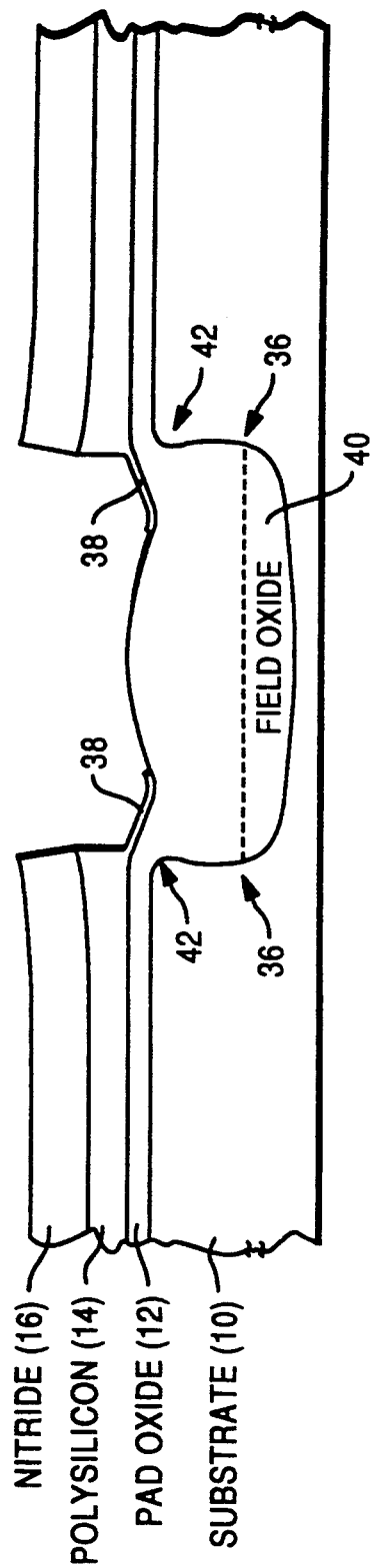

FIGS. 5–7 depict the structure at various stages in the growth of the field oxide. The exposed substrate 10 and sidewall nitride 32 is oxidized in a proportion to effectuate concurrent oxidation and lifting and bending, beginning at the low edge 33 of the retained sidewall silicon nitride 32. The field oxide growth uses a preferred field oxidation environment of $H_2 + O_2$, at a nominal temperature of approximately 900° C. for a nominal time of 750 minutes. Alternatively, a field oxidation environment of either a dry $O_2$ or $H_2 + O_2$, at a pressure of about 10 atm and a nominal temperature of about 875° C., for about 120 minutes may be employed. As the field oxide growth continues in progressing to the structure shown in FIG. 6, the former sidewall nitride layer 32 is fully lifted and bent. During this time, stress in sidewall regions 36 of silicon substrate 10 is relieved by the presence of the thin sidewall nitride at the commencement of oxidation and its further thinning by surface conversion to oxide during oxidation. At the stage of oxidation depicted in FIG. 6, nitride layers 38 would be thinned to approximately 3 nm or less.

FIG. 6 also illustrates that the lifting of the residual sidewall silicon nitride 38 exposes the relatively thick pad oxide 12 and polysilicon layer 14 near the end of oxidation. Pad oxide 12 then serves as a path for relieving volumetric increase stresses in field oxide 40 proximate silicon substrate corners 42, corners which otherwise would be likely to encounter stress induced dislocations. As the field oxide growth continues into the final stage depicted in FIG. 7, conversion of residual sidewall silicon nitride 38 to oxide opens a relatively short path for oxygen species to reach silicon substrate corners 42. The result is an accentuated oxidation rate at silicon substrate corners 42 to create corners 44 of relatively large radius, smooth contour, and reduced local stress. Again, the relatively thick pad oxide layer 12 provides a yielding path for the relief of localized stresses, which path supplements the vertically directed movement and relief in the region 46. Furthermore, the relatively limited growth of field oxide 40 over the lower corner regions 48 of nitride layer 16, by virtue of the masking by sidewall nitride layer 38 (FIG. 6), substantially suppresses the formation of notches or grooves in the field oxide at the edges of the active regions 22. The oxidation of the substrate and lifting of the sidewall silicon nitride continues and is complemented by an oxidation of polysilicon 16 until the upper surface of the oxidized substrate reaches a predetermined level, which in a preferred embodiment is at least as high as the interface between polysilicon layer 14 and nitride layer 16.

As a consequence of the balanced interaction between the lifting and bending of the sidewall nitride layer, the conversion of the sidewall nitride to an oxide, the relief of stress through the pad oxide, the accentuated conversion of the polysilicon at the edge of the active region near the conclusion of the oxidation step, and the multidirectional relief of stresses at the relatively rounded corners of the active regions, not only is the bird's beak problem substantially suppressed, but the active region does not experience stress induced dislocations nor does the structure of the field oxide incorporate deleterious notches or grooves.

FIG. 8 illustrates a representative integrated circuit structure, following the removal of a top layer of oxidized nitride (not shown) (formed during field oxide growth), the masking nitride 16 (FIG. 7), polysilicon layer 14 and pad oxide layer 12. In a preferred embodiment, both the oxidized nitride coating and pad oxide layer 12 are removed by chemical (HF) etching. Such etching is difficult to accurately control and overetching of the oxide can easily occur. In the previous RESSFOX process described in U.S. Pat. No. 4,923,563, if an overetch of the field oxide occurred, corners 44 of substrate 10 could be exposed. Reliability problems can be created when a subsequent gate oxide is formed over corners 44. A primary purpose of polysilicon layer 14 is to increase the thickness of the field oxide above the bird's beak thereby preventing corners 44 from becoming exposed in the event of an overetch. In this manner the criticality of the etching step is reduced.

Figure 9:
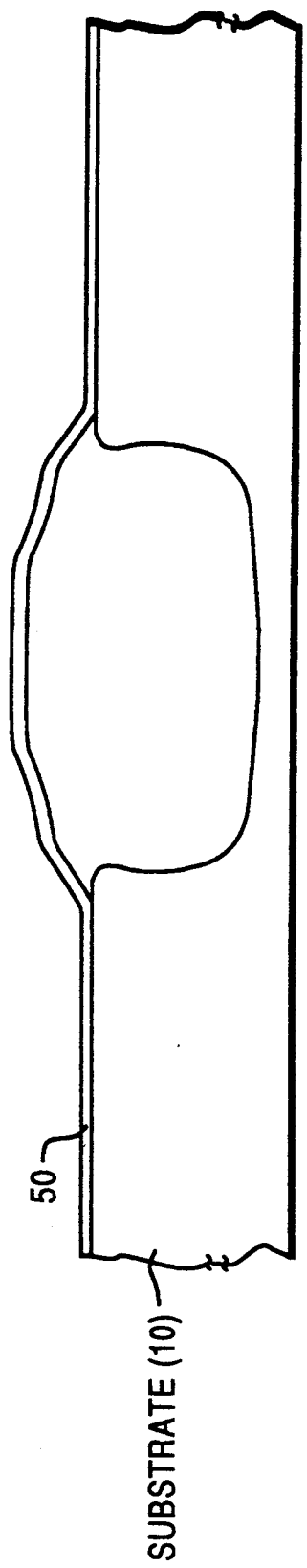

FIG. 9 shows the integrated circuit structure after forming a gate oxide layer 50 in preparation for the formation of active devices.

Figure 10:
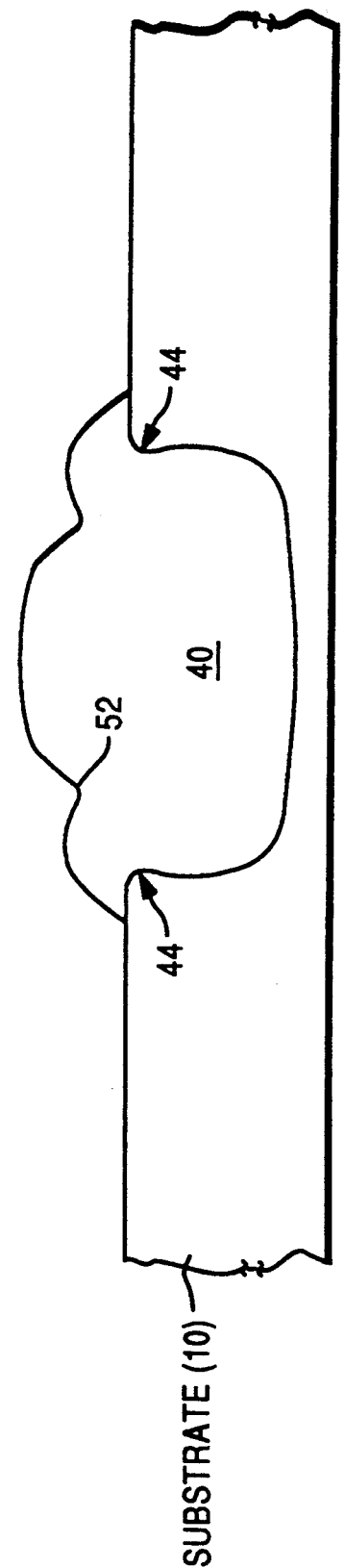
FIG. 10 is a cross-sectional schematic representation of an overetch of the field oxide.

FIG. 10 is a view similar to FIG. 8, but illustrating the structure following an inadvertent overetch of pad oxide layer 12. It should be noted that the dip 52 in field oxide 40 caused by the overetch does not expose corners 44.

It will be clear to those skilled in the art that the present invention is not limited to the specific embodiment disclosed and illustrated herein.

Numerous modifications, variations, and full and partial equivalents can be undertaken without departing from the invention as limited only by the spirit and scope of the appended claims.

What is desired to be secured by Letters Patent of the United States is as follows.

What is claimed is:

1. A structure for fabricating an integrated circuit comprising:
   a silicon substrate;
   a pad oxide layer overlying said substrate;
   a polysilicon layer overlying said oxide layer;
   a first nitride layer overlying said polysilicon layer;
   an opening through said first nitride, polysilicon and pad oxide layers and into said silicon substrate defining a region for field oxide growth, comprising a sidewall surface and an adjoining bottom surface; and
   a second nitride layer having a thickness of less than 25 nm overlying said sidewall surface.

2. The structure of claim 1 wherein said polysilicon layer has a thickness of 3–100 nm.

3. The structure of claim 1 wherein said pad oxide has a thickness of 5–100 nm.

4. The structure of claim 1 wherein said first nitride layer has a thickness of 10–500 nm.

5. The structure of claim 1 wherein said second nitride layer has a thickness of 5–25 nm.

6. The structure of claim 1 wherein said sidewall surface is substantially normal with respect to said bottom surface, said pad oxide, polysilicon and first nitride layers.

7. The structure of claim 1 wherein said bottom surface of said opening consists essentially of exposed substrate silicon.

8. The structure of claim 1 further comprising:
   a screening oxide disposed between said sidewall surface of said opening and said second nitride layer.

9. The structure of claim 8 wherein said screening oxide has a thickness of less than 20 nm.

10. The structure of claim 1 wherein the depth of the opening within the substrate is between 30 and 150 nm.

11. A structure for fabricating an integrated circuit comprising:
    a silicon substrate;
    a pad oxide layer having a thickness of 5–100 nm overlying said substrate;
    a polysilicon layer having a thickness of 3–100 nm overlying said pad oxide layer;
    a first nitride layer having a thickness of 10–500 nm overlying said polysilicon layer;
    an opening through said first nitride, polysilicon and pad oxide layers into said silicon substrate defining a region for field oxide growth, comprising a sidewall surface and an adjoining bottom surface, wherein the depth of the opening within the substrate is between 30 and 150 nm;
    a second nitride layer having a thickness of 5–25 nm overlying said sidewall surface; and
    a thin screening oxide having a thickness of less than 20 nm disposed between said sidewall surface of said opening and said second nitride layer;
    wherein said sidewall surface is substantially normal with respect to said bottom surface, said pad oxide, polysilicon and first nitride layers; and
    wherein said bottom surface of said opening consists essentially of exposed substrate silicon.

* * * * *